United States Patent [19]
Kamei et al.

[11] Patent Number: 6,090,211
[45] Date of Patent: Jul. 18, 2000

[54] APPARATUS AND METHOD FOR FORMING SEMICONDUCTOR THIN LAYER

[75] Inventors: Hidenori Kamei; Hidemi Takeishi; Yasunari Oku, all of Fukuoka, Japan

[73] Assignee: Matsushita Electric Industrial Co., Ltd., Osaka, Japan

[21] Appl. No.: 08/820,390

[22] Filed: Mar. 12, 1997

[30] Foreign Application Priority Data

Mar. 27, 1996 [JP] Japan ................................. 8-072721
Nov. 21, 1996 [JP] Japan ................................. 8-310323

[51] Int. Cl.$^7$ .................................................. C23C 16/00
[52] U.S. Cl. ........................ 118/725; 118/715; 118/728; 438/758
[58] Field of Search ................... 118/715, 725, 118/728; 438/758

[56] References Cited

U.S. PATENT DOCUMENTS

| | | | |
|---|---|---|---|
| 3,696,779 | 10/1972 | Murai | 118/725 |
| 3,750,620 | 8/1973 | Eversteijn | 118/725 |
| 4,105,810 | 8/1978 | Yamazaki | 427/255.3 |
| 4,651,673 | 3/1987 | Muething | 118/725 |
| 4,673,799 | 6/1987 | Mahawili | 118/725 |
| 4,728,863 | 3/1988 | Wertheimer | 118/715 |
| 4,732,110 | 3/1988 | Parsons | 118/725 |
| 4,961,399 | 10/1990 | Frijlink | 118/725 |
| 5,033,407 | 7/1991 | Mizuno | 118/725 |
| 5,252,131 | 10/1993 | Kiyama | 118/725 |
| 5,268,067 | 12/1993 | Dostalik | 118/728 |
| 5,370,738 | 12/1994 | Watanabe | 118/725 |

FOREIGN PATENT DOCUMENTS

| | | | |
|---|---|---|---|
| 61-271822 | 12/1986 | Japan | 118/725 |
| 2-279588 | 11/1990 | Japan | 118/725 |

OTHER PUBLICATIONS

Groves, J. Crystal Growth, 93 (1988) 242–247.
Frijlink, "A New Versatile, Large Size MOVPE Reactor," J. Crystal Growth vol. 93, 1988, p.p. 207–215.
Tompa, et al., "Design and operating characteristics of a metalorganic vapor phase epitaxy production scale, vertical, high speed rotating disk reactor," J. Crystal Growth vol. 145, 1994, p.p. 655–661.

*Primary Examiner*—Richard Bueker
*Attorney, Agent, or Firm*—Stevens, Davis, Miller & Mosher, L.L.P.

[57] ABSTRACT

A method and apparatus for forming a semiconductor thin layer on a substrate surface employs a gas outlet for supplying gas to the substrate, a rotatable holder for holding the substrate thereon such that a surface of the substrate is exposed to the gas while the substrate orbits with rotation of the holder, and a heater generates and supplies heat energy to the substrate. A cover wall extends over the surface of the substrate which is exposed to the gas. A distance between the exposed surface of the substrate and the cover wall in a direction parallel to a rotational axis of the rotatable holder decreases radially outward over the substrate orbiting with rotation of the holder about a rotational axis of the holder.

13 Claims, 6 Drawing Sheets

APPARATUS AND METHOD FOR FORMING SEMICONDUCTOR THIN LAYER

BACKGROUND OF THE INVENTION AND RELATED ART STATEMENT

The present invention relates to an apparatus and method for forming a semiconductor thin layer on a substrate with a gas phase crystal growth, a molecular beam epitaxy or the like.

Journal of Crystal Growth 93 published on 1988 discloses on pages 207–215 thereof a material gas distribution to a plurality of substrates heated by a heater arranged at a bottom of a container in a gas phase crystal growth apparatus. Journal of Crystal Growth 145 published on 1994 discloses on pages 655–661 thereof various substrate movements under the material gas flow in another gas phase crystal growth apparatus.

OBJECT AND SUMMARY OF THE INVENTION

An object of the present invention is to provide an apparatus and method for forming a semiconductor thin layer on a front surface of a substrate with a gas phase crystal growth, a molecular beam epitaxy or the like, by which apparatus and method a material gas (generally, mixture of a carrier gas and a material of the semiconductor thin layer) flows stably over the front surface, and/or a temperature of the substrate is changed quickly.

In the present invention, an apparatus for forming a semiconductor thin layer on a front surface of a substrate, comprises, a gas outlet from which a gas is supplied to the front surface, a holder adapted to hold the substrate thereon in such a manner that the front surface is exposed to the gas, and a heater generating a heat energy supplied to the substrate so that the substrate is heated to form the semiconductor thin layer on the front surface with the gas.

When the substrate has a reverse surface opposite to the front surface in a substrate thickness direction, and the front surface is arranged at a vertically lower position in comparison with the reverse surface so that the front surface on which the semiconductor thin layer should be formed receives, interrupts or blocks a vertically upward flow component of the gas (that is, the gas including a vertically upward flow-direction-component) generated with a convection gas flow caused by heating of the heater, the gas is pressed against or urged vertically upward toward the front surface by the gas convection to keep a stable flow of the gas over the front surface. The gas applied to the front surface may include also a horizontal flow-direction-component.

When the front surface is arranged at a vertically higher position in comparison with the gas outlet so that the front surface receives the vertically upward flow component of the gas flowing out from the gas outlet, the gas flowing out from the gas outlet and urged vertically upward by the gas convection caused by heating of the heater flows to or reaches the front surface smoothly and quickly without descending.

When the front surface is arranged at a vertically lower position in comparison with the heater, the gas contacting with the heater to be heated thereby is prevented from flowing directly upward to the front surface, and flows upward to the front surface after descending.

When a cover wall extends over the front surface so that a distance between the front surface and the cover wall decreases in a flow direction of the gas, the gas is urged toward the front surface over the front surface by the cover wall to keep the stable gas flow over the front surface. When the cover wall extends over the front surface to form a flow passage of the gas with the front surface so that a cross-sectional area of the flow passage for a flow of the gas decreases in the flow direction of the gas, a flow velocity of the gas is increased in the flow direction of the gas. When the cross-sectional area of the flow passage for the flow of the gas is substantially constant over the front surface in the flow direction of the gas, the flow velocity of the gas is kept substantially constant over the front surface in the flow direction of the gas.

When the gas outlet guides the gas to flow therein substantially parallel to the front surface, the gas flows stably along the front surface. When a plurality of the gas outlets from each of which the gas is supplied to the front surface extend substantially parallel to each other so that the gases flow substantially parallel to each other after flowing out from the gas outlets to restrain a mechanical mixture of the gases and accelerate a diffusion mutual mixture of the gases after the gases flow out from the gas outlets, each of the materials of the semiconductor thin layers in the gas is stably supplied to or reaches the front surface without excessive mixing and/or interaction between the materials. A relative movement (preferably, rotational) may be generated between the gas outlet and the substrate.

When the holder is adapted to hold a plurality of the substrates on an imaginary substantially-circular line, and the gas flows out from the gas outlet at a substantially-central position of the imaginary circular line, the gas is distributed uniformly among the substrates. When the holder has a plurality of sub-holders adapted to hold a plurality of the substrates thereon respectively, the sub-holders are rotatable on respective rotational axes arranged on an imaginary substantially-circular line, and the gas flows out from the gas outlet at a substantially-central position of the imaginary circular line toward the substrates, the gas is distributed uniformly among the substrates and uniformly over each of the substrate.

In an apparatus for forming a plurality of semiconductor thin layers on a front surface of a substrate, comprising, a holder adapted to hold the substrate thereon, and a heater generating a radiant heat energy supplied to the substrate so that the substrate is heated to form the semiconductor thin layer on the front surface by, for example, molecular beam epitaxy in a vacuumed condition or gas phase crystal growth in the gas, according to the present invention, since a distance between the substrate and the heater is changeable to adjust an amount of the radiant heat energy supplied to the substrate in accordance with each of the semiconductor thin layers to be formed one after another on the front surface, a temperature of the substrate is quickly changed by adjustment of the distance between the substrate and the heater performed by a servo-control positioning device without a time delay of temperature saturation of the heater performed by change of input power to the heater. A time for the adjustment of the distance between the substrate and the heater performed by the servo-control positioning device is generally shorter than a time for obtaining the temperature saturation of the heater performed by the change of input power to the heater.

According to the present invention, a method for forming a semiconductor thin layer on a front surface of a substrate, comprises, the steps of:

generating a vertically-upward flow component of a gas, arranging the front surface in the vertically-upward flow component of the gas so that the front surface blocks the vertically-upward flow component of the gas to be exposed to the vertically-upward flow component of the gas, and forming the semiconductor thin layer from the gas on the front surface.

Since the front surface blocks or interrupts the vertically-upward flow component of the gas to be exposed to the vertically-upward flow component of the gas, the gas of the vertically-upward flow component is pressed against or urged toward the front surface to keep the stable flow of the gas over the front surface, so that a material of the semiconductor thin layer included by the gas and/or an assistant substance in the gas for forming the semiconductor thin layer is securely supplied to or reaches the front surface without being restrained by the gas convection on the front surface. The vertically-upward flow component of the gas is generated by relatively light or small specific gravity of the gas to be supplied to the front surface in comparison with the gas surrounding the gas to be supplied to the front surface, or by urge of the gas convection or compelled gas flow generated by, for example, heating, pump, fan or the like.

When the front surface is arranged at a vertically higher position in comparison with a gas outlet from which the gas flows out so that the gas flows vertically upward toward the front surface from the gas outlet, the vertically-upward flow component of the gas flowing out from the gas outlet flows to or reaches the front surface smoothly and quickly without descending.

When a flow velocity of the gas is restrained from decreasing in a gas flow direction over the front surface after the vertically-upward flow component of the gas is blocked by the front surface, a formation of the semiconductor thin layer is accelerated or maintained securely even at a rear end of the front surface in the gas flow direction, that is, the formation of the semiconductor thin layer is performed uniformly over the whole of the front surface regardless of position on the front surface in the gas flow direction.

When a distance between the substrate and a heater generating a radiant heat energy to heat the substrate is changed to adjust a temperature of the substrate according to the semiconductor thin layer to be formed on the front surface, a temperature of the substrate is quickly changed by adjustment of the distance between the substrate and the heater performed by a servo-control positioning device without a time delay of temperature saturation of the heater performed by change of input power to the heater.

When the substrate is heated from a vertically-upper side of the substrate to heat the vertically-upward flow component of the gas at the substrate, the gas contacting with the heater to be heated thereby is prevented from flowing directly upward to the front surface, and flows upward to the front surface after descending, so that a part of the gas excessively heated by the direct contact with the heater is prevented from being supplied directly to the front surface, and a smooth removal of the vertically-upward flow component of the gas and a smooth supply or refreshing of the vertically-upward flow component of the gas on the front surface is accelerated by the heating of the substrate from the vertically-upper side of the substrate.

DETAILED DESCRIPTION OF PREFERRED EMBODIMENTS

Figure 1:
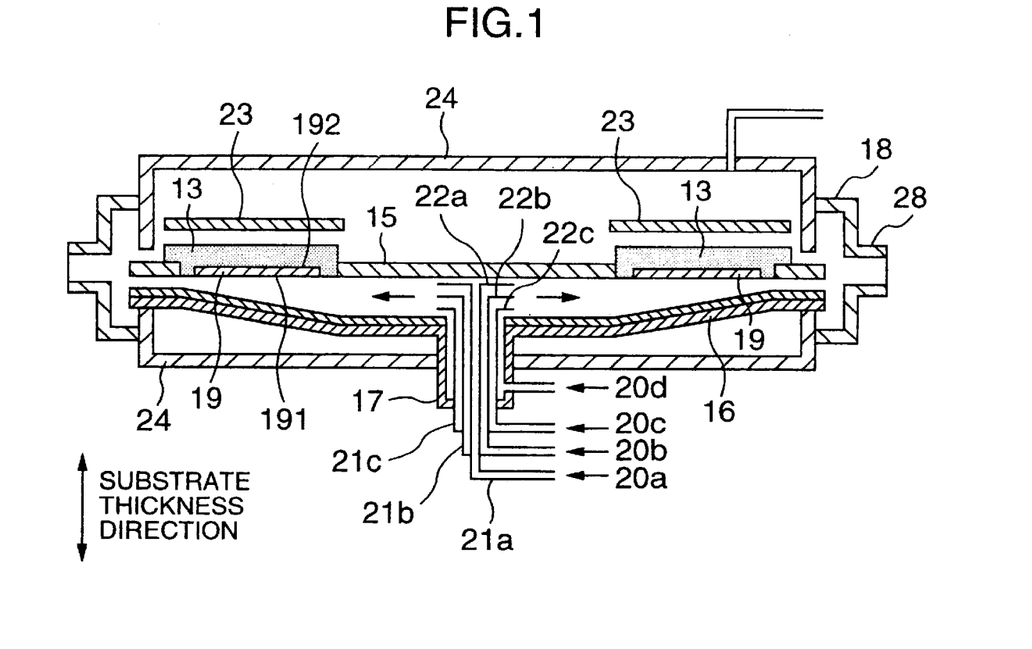
FIG. 1 is a schematic cross-sectional view of a semiconductor thin layer forming apparatus according to the present invention.
Figure 2:
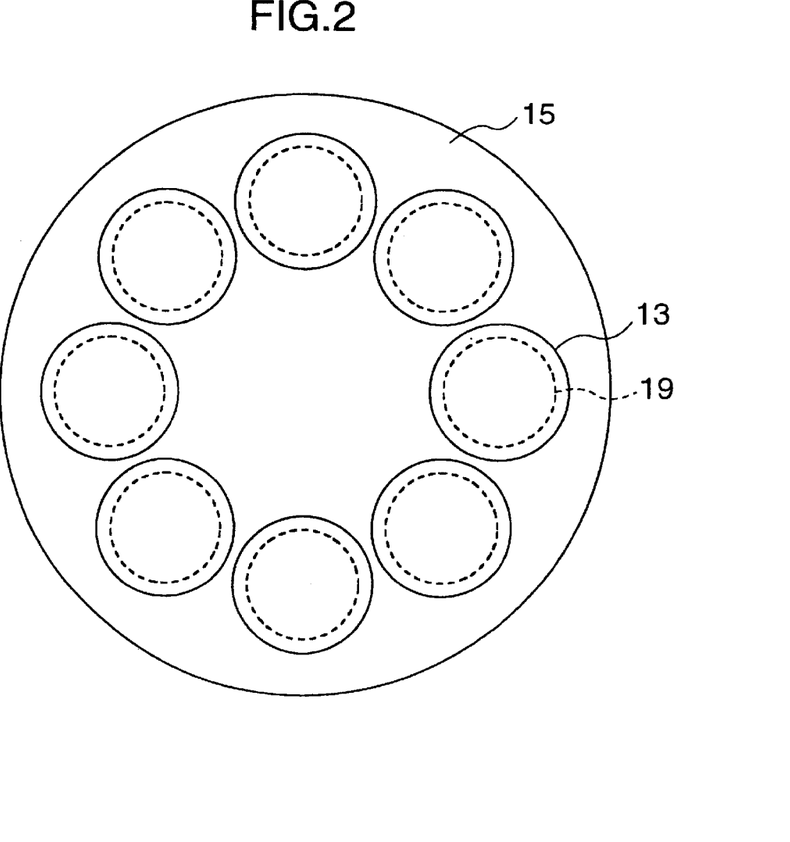
FIG. 2 is a schematic front view of a substrate holder of the apparatus shown in FIG. 1.

In a first embodiment of the present invention as shown in FIGS. 1 and 2, a disk-shaped substrate holder 15 made of quartz, and a laminated cover wall 16 formed by a stainless-steel plate and a quartz plate and arranged under the substrate holder 15 are contained by a hermetically sealed chamber 24 made of stainless steel, and a gas outlet device 17 opens under the substrate holder 15 coaxially with the substrate holder 15. At least one gas as the claimed gas, generally including a carrier gas and a material of a semiconductor thin layer, or being an ambient gas on forming the semiconductor thin layer, preferably a plurality of the gases, flows out radially from the gas outlet device 17 toward an annular exhaust chamber 18 and exhaust pipes 28 between the substrate holder 15 and the cover wall 16, and the gases are guided by the gas outlet device 17 to flow substantially parallel to each other along a lower surface of the substrate holder 15. Disk-shaped substrate sub-holders 13 made of carbon are received in the substrate holder 15 in such a manner that lower surfaces of the sub-holders 13 and the lower surface of the substrate holder 15 are arranged in a common imaginary plane. Substrate 19 are mounted on the substrates holder 15 through the lower surfaces of the sub-holders 13, and a lower surface 191 of each of the substrates 19 as the claimed front surface on which the semiconductor thin layer is formed is exposed to the gases and faces to the cover wall 16. Reverse or upper surfaces 192 of the substrates 19 as the claimed reverse surface contact the sub-holders 13. The sub-holders 13 are arranged on an imaginary circular line coaxial with the substrate holder 15.

The cover wall 16 extends radially and inclines relative to the horizontal direction so that a vertical distance between the cover wall 16 and the lower or front surfaces 191 extending substantially horizontally decreases radially outward from a central position of the substrate holder 15, that is, in a gas flow direction. Therefore, a velocity of the gas is prevented from being decreased in the gas flow direction to be substantially uniform or constant, most preferably slightly increased, on the lower surfaces 191 in the gas flow direction. For example, the vertical distance between the cover wall 16 and the lower or front surfaces 191 decreases from 13 mm at a radial position of 50 mm from the central position of the substrate holder 15 to 5 mm at a radial position of 130 mm therefrom.

The gas outlet device 17 has three coaxial cylindrical tubes 21a, 21b and 21c, and three disk-shaped and substantially-horizontally-extending guide plates 22a, 22b and 22c for guiding gases 20a, 20b, 20c and 20d to flow substantially parallel to each other and to the lower surfaces 191 from the cylindrical tubes 21a, 21b and 21c toward the lower surfaces 191. Heaters 23 arranged above the substrate holder 15 generate radiant heat energy for heating the substrates 19 through the sub-holders 13 of the substrate holder 15.

Figure 3:
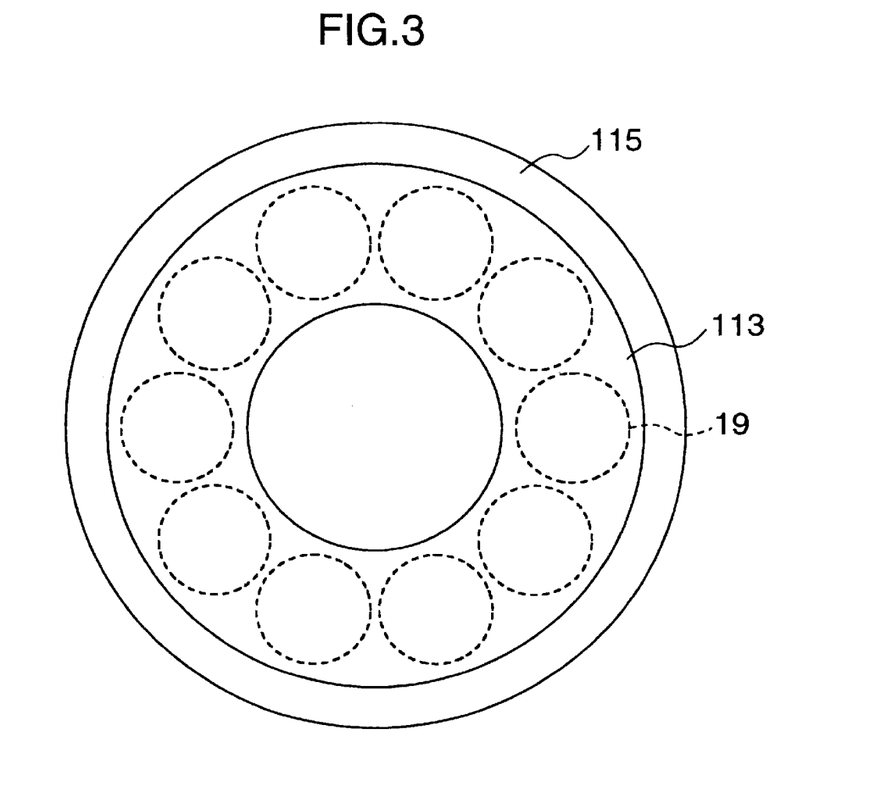
FIG. 3 is a schematic front view of another substrate holder of another semiconductor thin layer forming apparatus according to the present invention.

In a second embodiment of the present invention as shown in FIG. 3, a substitute substrate holder 115 has thereon an annular detachable substitute sub-holder 113 on which the substrates 19 are mounted. Lower surfaces of the substitute substrate holder 115 and the substitute sub-holder 113 extend on a common substantially horizontal imaginary plane. A plurality of the sub-holders 113 may be stacked coaxially with each other and the substitute substrate holder 115.

Figure 4:
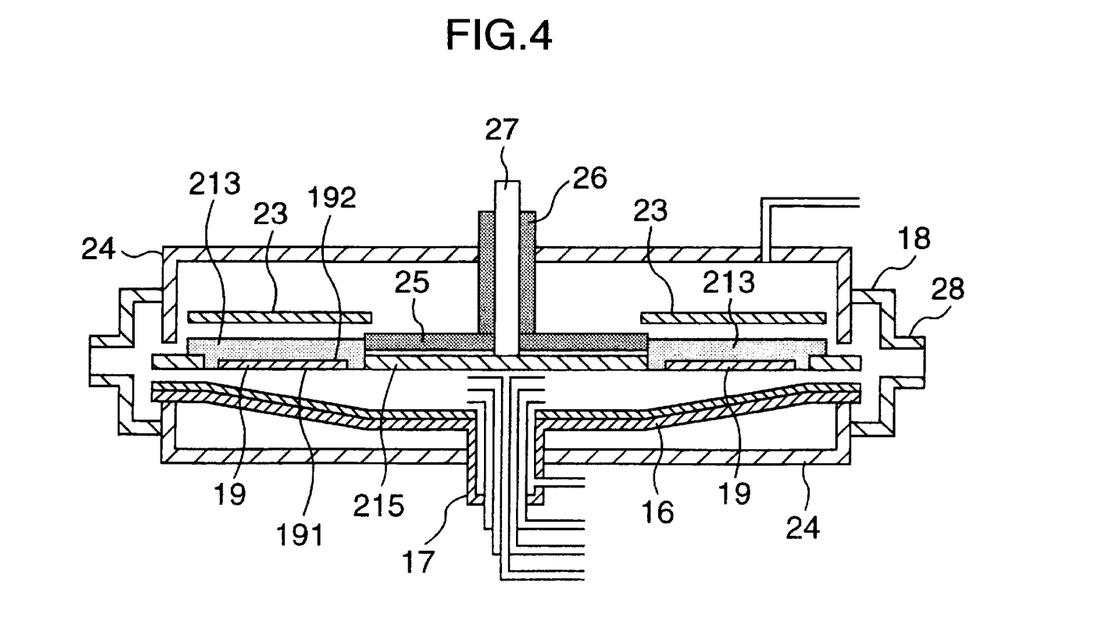
FIG. 4 is a schematic cross-sectional view of another semiconductor thin layer forming apparatus according to the present invention.
Figure 5:
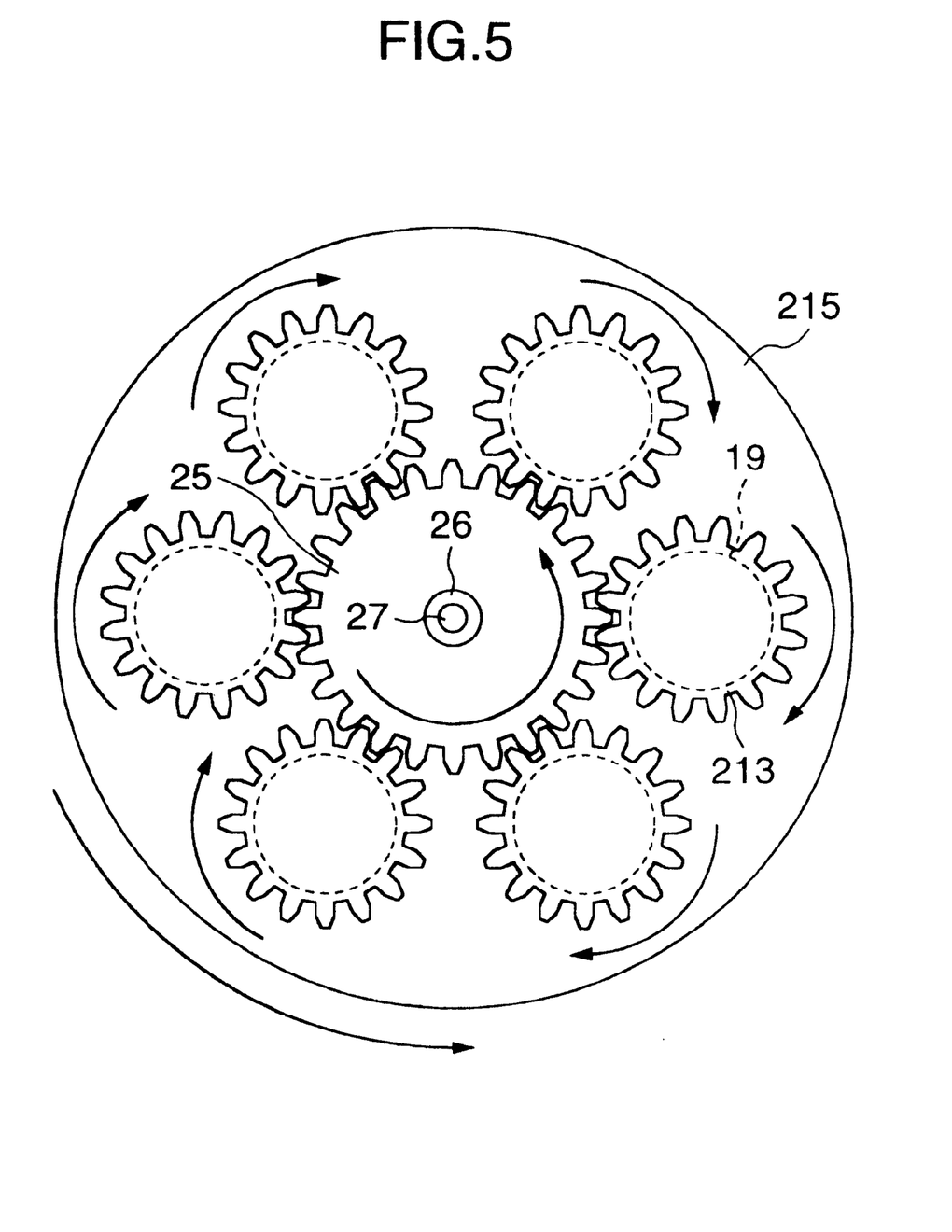
FIG. 5 is a schematic front view of another substrate holder of the apparatus shown in FIG. 4.

In a third embodiment of the present invention as shown in FIGS. 4 and 5, a substitute substrate holder 215 has thereon a plurality of substitute toothed disk-shaped sub-holders 213 made of carbon on which the substrates 19 are mounted. The toothed sub-holders 213 are arranged on an imaginary circular line coaxial with the substrate holder 215. The toothed sub-holders 213 are rotated by a shaft 26 through a toothed wheel 25 made of carbon, and the substrate holder 215 is rotated by a shaft 27, so that the gases flowing out radially from the gas outlet device 17 are distributed uniformly among the substrates 19 and over the whole of each of the front surfaces 191 of the substrates 19.

Figure 6:
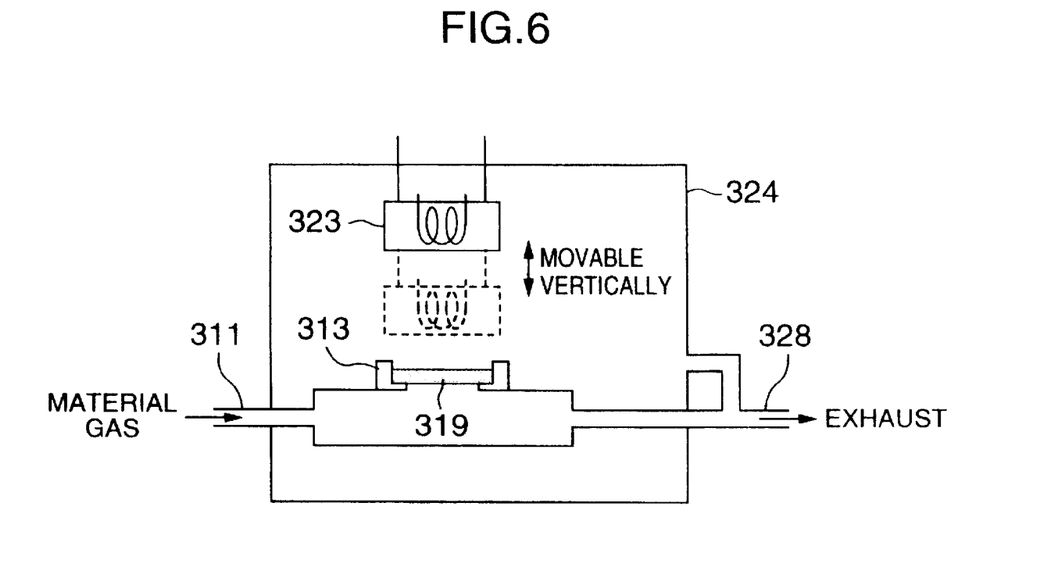
FIG. 6 is a schematic side view of another semiconductor thin layer forming apparatus according to the present invention.
Figure 7:
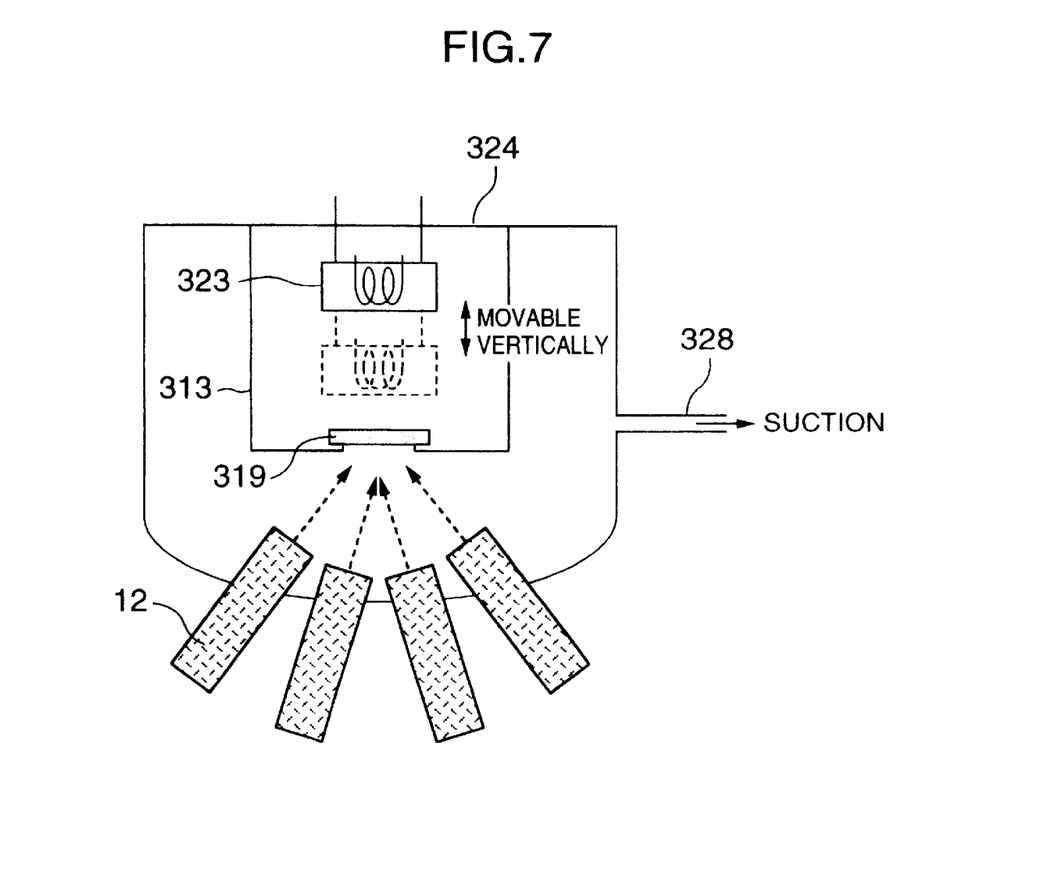
FIG. 7 is a schematic side view of another semiconductor thin layer forming apparatus according to the present invention.

In fourth and fifth embodiments of the present invention as shown in FIGS. 6 and 7, a substrate 319 is mounted on a substrate holder 313 and heated by radiant heat energy generated by a heater 323. A temperature of the substrate 319 is adjusted by changing a distance between the heater 323 and the substrate 319 or the substrate holder 313 without necessity of changing a temperature or output of the heater 323, so that the temperature of the substrate 319 is quickly and correctly adjusted in comparison with changing the temperature or output of the heater 323. Since the temperature of the substrate 319 is quickly adjusted to a desired degree for forming each of a plurality of the semiconductor thin layers on the substrate in comparison with the prior art, a deterioration of the previously formed one of the semiconductor thin layers (particularly surface deterioration thereof) during a time delay of adjusting the temperature of the substrate 319 for a subsequent one of the semiconductor thin layers to be newly formed is restrained. The temperature of the substrate 319 is measured by a contact or non contact (radiant heat measuring) sensor.

In the fourth embodiment shown in FIG. 6, the semiconductor thin layer is formed on the substrate 319 by using a gas phase crystal growth with a material gas inlet 311 and an exhaust or suction outlet 328, and in the fifth embodiment shown in FIG. 7, the semiconductor thin layer is formed on the substrate 319 by using a molecular beam epitaxy with a molecular (atomic) beam source 12 for generating molecular (atomic) beam toward the substrate 319.

Figure 8:
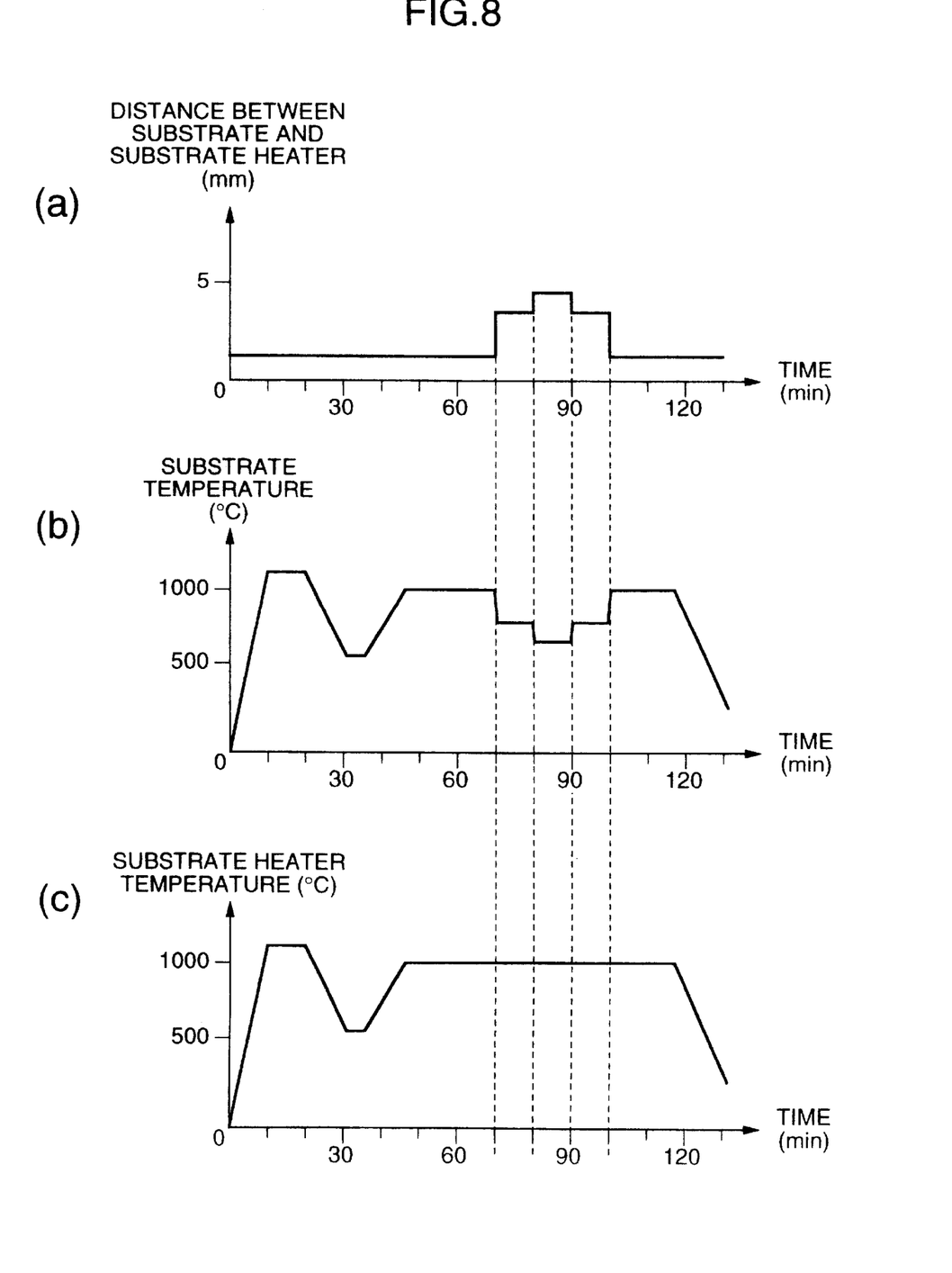
FIG. 8 is a combination of diagrams showing respective variations of heater movement relative to the substrate, heater temperature and substrate temperature according to a time proceeding.
Figure 9:
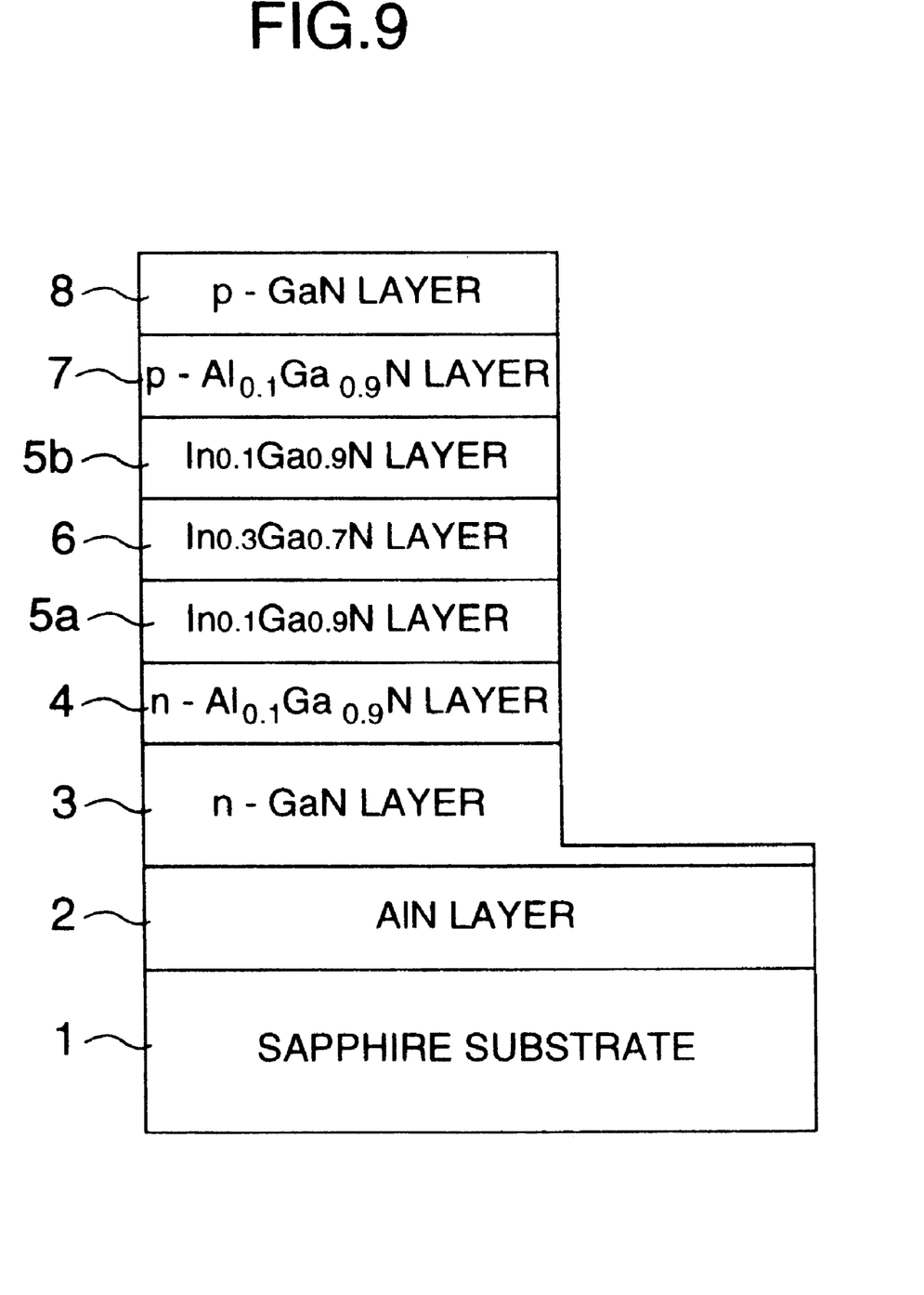
FIG. 9 is a schematic side view showing a stack of semiconductor thin layers formed on the substrate.

By the fourth embodiment, a stack of the semiconductor thin layers ($Al_X In_Y Ga_{1-x-y}$ N compound type, $0 \leq X \leq 1$, $0 < Y \leq 1$, $X+Y \leq 1$) as shown in FIG. 9 is formed as follows. Control of the distance between the substrate and the heater, and temperature variations of the substrate and the heater in accordance with time proceedings are performed as shown in FIG. 8.

Hydrogen is supplied sufficiently to a sapphire substrate 1 on the substrate holder 313 after being cleaned. Thereafter, the substrate 1 is heated to 1100° C. and maintained at 1100° C. for 10 minutes to perform thermal cleaning (removal of water). Thereafter, the heater temperature is decreased from 1100° C. to 600° C. to decrease the substrate temperature to 600° C., and subsequently $NH_3$ of 5 slm and trimethylaluminum (TMA) of 5 sccm are supplied into the chamber 324 to form AlN layer 2 of 50 nm thickness.

Thereafter, the heater temperature is increased from 600° C. to 1000° C. to increase the substrate temperature to 1000° C., and trimethylgallium (TMG) of 5 sccm and 10-ppm $SiH_4$ (mono-silane) of 100 sccm are supplied into the chamber 324 to form n-type GaN layer 3 doped with Si of 2 µm thickness. Subsequently, TMG of 4 sccm and TMA of 2 sccm are supplied thereinto to form n-type $Al_{0.1} Ga_{0.9}$ N layer 4 doped with Si of 0.1 µm thickness.

Thereafter, the distance between the heater 323 and the sapphire substrate 1 on the substrate holder 313 is increased vertically by 3 mm from its original distance to decrease the substrate temperature from 1000° C. to 800° C., while supplies of TMA, TMG and $SiH_4$ are stopped. Subsequently, trimethylindium (TMI) of 100 sccm, TMG of 2 sccm and $NH_3$ of 5 slm are supplied thereinto to form $In_{01} Ga_{0.9}$ N layer 5a of 5 nm thickness.

Thereafter, the distance between the heater 323 and the sapphire substrate 1 on the substrate holder 313 is increased vertically by 2 mm to decrease the substrate temperature from 800° C. to 700° C., while supply of $NH_3$ is stopped. Subsequently, TMI of 300 sccm and TMG of 1 sccm are supplied thereinto to form $In_{0.3} Ga_{0.7}$ N layer 6 of 5 nm thickness.

Thereafter, the distance between the heater 323 and the sapphire substrate 1 on the substrate holder 313 is decreased vertically by 2 mm to increase the substrate temperature from 700° C. to 800° C. Subsequently, TMI of 100 sccm, TMG of 2 sccm and $NH_3$ of 5 slm are supplied thereinto to form $In_{0.1} Ga_{0.9}$ N layer 5b of 5 nm thickness.

Thereafter, the distance between the heater 323 and the sapphire substrate 1 on the substrate holder 313 is decreased vertically by 3 mm to increase the substrate temperature from 800° C. to 1000° C. Subsequently, cyclopentadienyl-magnesium (Cp2Mg) of 100 sccm is supplied in addition to TMI, TMG and $NH_3$ to form p-type $Al_{0.1} Ga_{0.9}$ N layer 7 doped with Mg of 0.1 µm thickness. Thereafter, p-type GaN layer 8 doped with Mg of 0.5 µm thickness is formed by stopping the supply of TMA.

By changing the distance between the heater 323 and the sapphire substrate 1 or the substrate holder 313 to adjust the substrate temperature, a time for changing the substrate temperature between 1000° C. and 800° C. is about one minute, and a time for changing the substrate temperature between 800° C. and 700° C. is about 30 seconds. These times are 20% of respective times by changing the output of the heater to adjust the substrate temperature.

Thereafter, the stack of the semiconductor thin layers is etched by approximately 1 µm to expose the n-type GaN layer by plasma discharge of 200 W output with chlorine gas of 5 sccm and hydrogen gas of 5 sccm in ECR dry etching. Each of the semiconductor thin layers of N and P types is connected to an electrode to form a blue-light emitting LED.

What is claimed is:

1. An apparatus for forming a semiconductor thin layer on a surface of a substrate, said apparatus comprising:
   a gas outlet for supplying a gas to the substrate,
   a holder which is rotatably mounted and which is for holding the substrate thereon such that a surface of the substrate is exposed to the gas while the substrate orbits with rotation of the holder about a rotational axis of the holder, a heater for generating and supplying heat energy to the substrate held on the holder so that the substrate is heated to form the semiconductor thin layer on said surface of the substrate, and a cover wall for extending over said surface of the substrate, wherein a distance between said surface of the substrate and the cover wall in a direction parallel to the rotational axis of the rotatable holder decreases in a direction radially outward from said rotational axis of the holder over the substrate orbiting with rotation of the holder.

2. An apparatus according to claim 1, wherein the holder is for holding thereon a plurality of substrates arranged along an imaginary substantially-circular line.

3. An apparatus according to claim 1, wherein the gas flows out from said gas outlet which is arranged at a relatively radially inner side in comparison with the substrate orbiting with rotation of the holder.

4. An apparatus according to claim 1, wherein the holder has a plurality of sub-holders for holding thereon a plurality of substrates, the sub-holders being rotatable on respective rotational axes of the sub-holders and being arranged along an imaginary substantially-circular line centered at said rotational axis of the holder.

5. An apparatus according to claim 1, wherein the distance between said surface of the substrate and the cover wall in said direction parallel to the rotational axis of the rotatable holder decreases in a direction perpendicular to (i) a tangential direction of the orbital motion of the substrate and (ii) the rotational axis of the rotatable holder.

6. An apparatus according to claim 1, wherein the distance between said surface of the substrate and the cover wall in said direction parallel to the rotational axis of the rotatable holder decreases substantially continuously over said surface of the substrate.

7. An apparatus according to claim 1, wherein the cover wall extends upwardly from a relatively radially inner side toward a relatively radially outer side over the surface of said substrate orbiting with rotation of the holder.

8. An apparatus according to claim 1, wherein said surface of the substrate is a front surface on which the semiconductor thin layer is formed and said substrate includes a reverse surface opposite to the front surface in a substrate thickness direction, said front surface being arranged at a vertically lower position in comparison with said reverse surface so that the front surface receives a vertically upward flow component of the gas.

9. A method for forming a semiconductor thin layer on a front surface of a substrate positioned on a rotatable holder, said method comprising the steps of:

generating an orbital motion of the substrate by rotating said rotatable holder while exposing said front surface of said substrate to a gas, and supplying heat energy to the substrate to form said semiconductor thin layer on said front surface from the gas, and causing said gas to flow radially outward in a space confined between said front surface of said substrate and a cover wall when the substrate undergoes said orbital motion and said front surface is exposed to the gas, wherein a distance between said front surface of said substrate and the cover wall in a direction parallel to a rotational axis of the rotatable holder decreases radially outward over the substrate orbiting with rotation of the holder.

10. A method according to claim 9, wherein the substrate has a reverse surface opposite to the front surface in a substrate thickness direction, and the front surface is arranged at a vertically lower position in comparison with the reverse surface so that the front surface receives a vertically upward flow component of the gas.

11. A method according to claim 9, wherein the distance between the front surface and the cover wall in the direction parallel to the rotational axis of the rotatable holder decreases in a direction perpendicular to (i) a tangential direction of the motion of the substrate orbiting with rotation of the holder and (ii) the rotational axis of the rotatable holder.

12. A method according to claim 9, wherein the gas flows out radially outward from a gas outlet which is arranged at a relatively radially inner side in comparison with the substrate orbiting with rotation of the holder.

13. A method according to claim 9, wherein the substrate is rotated on a rotational axis which orbits with the rotation of the rotatable holder.

* * * * *